US006509635B1

(12) United States Patent
Poddar

(10) Patent No.: US 6,509,635 B1
(45) Date of Patent: Jan. 21, 2003

(54) INTEGRATED CIRCUIT PACKAGE HAVING OFFSET DIE

(75) Inventor: Anindya Poddar, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 37 days.

(21) Appl. No.: 09/724,912

(22) Filed: Nov. 28, 2000

(51) Int. Cl.[7] ................................................ H01L 23/02

(52) U.S. Cl. ....................... 257/678; 257/666; 257/670; 257/676; 257/692; 257/693; 257/723

(58) Field of Search ................................ 257/678, 666, 257/676, 670, 692, 693, 723; 361/813; 438/106

(56) References Cited

U.S. PATENT DOCUMENTS

| | | | | |
|---|---|---|---|---|
| 5,926,695 A | * 7/1999 | Chu et al. | ................... | 438/111 |
| 6,008,534 A | * 12/1999 | Fulcher | ...................... | 257/690 |
| 6,111,315 A | 8/2000 | Stearns et al. | .............. | 257/706 |
| 6,255,135 B1 | * 7/2001 | Barrow | ........................ | 438/106 |
| 6,307,755 B1 | * 10/2001 | Williams et al. | ............ | 361/813 |

* cited by examiner

*Primary Examiner*—Richard Elms
*Assistant Examiner*—Douglas M Menz
(74) *Attorney, Agent, or Firm*—Beyer Weaver & Thomas

(57) ABSTRACT

Grid array-type packages having a die offset relative to the center point of the surface of the package substrate are described. In some embodiments, the die may be attached in a die attach area offset on the surface of the substrate relative to the center point of the surface of the substrate. In other embodiments, the die may be mounted in a die cavity formed in the substrate and offset relative to the center point of the surface of the substrate. In packaging die having an unequal distribution of bond pads, in one embodiment, the die, die attach area and/or die cavity are offset on the substrate away from the side of the die having the higher bond pad density and toward the side of the die having the lower bond pad density so as to increase available routing space on the side of the substrate adjacent the side of the die having the higher bond pad density.

16 Claims, 5 Drawing Sheets

INTEGRATED CIRCUIT PACKAGE HAVING OFFSET DIE

FIELD OF THE INVENTION

The present invention relates generally to integrated circuit packages. More specifically, the present invention relates to grid array-type integrated circuit packages.

BACKGROUND OF THE INVENTION

Current industry emphasis on decreased size and increased functionality of semiconductor dice has resulted in the continuing development of integrated circuit dice having a high density of active circuits, or cells. Conventionally, each cell has a bond pad fabricated at the surface of the die that serves as the input/output (I/O) contact for the cell. Typically, the bond pads are located along the edges of each side of the die for ease of connection of the bond pads to electrical contacts on another substrate, such as bond fingers on a package substrate. While a die may have analog and/or digital circuits, a growing number of dice, especially in networking products, include both.

Mixed signal dice have both analog and digital circuits. These dice are often rectangular in shape to accommodate the sizing requirements of the products they are installed in. Further, they are typically designed with the analog circuits isolated to one side of the die from the digital circuits. As analog cells are generally larger than digital cells, the analog side of the die tends to have a lower density of bond pads than an opposite digital side of the die. A result of this is that, when the die is packaged, the analog side of the die may require a significantly lower number of signal routings from the bond pads to the package than an opposite digital side.

Most high density integrated circuit dice are conventionally incorporated into an integrated circuit package to protect the die and provide a large number of external contacts to allow conductive interconnection of the packaged die to another substrate. One type of package that is widely used in packaging high-density dice, including those having both analog and digital circuits, is a grid array-type package. Examples of grid array-type packages include pin grid array packages, ball grid array packages, and various surface mount grid array packages.

Generally, some grid array-type packages centrally mount the die on the surface of the package substrate, for example, a plastic ball grid array package; while, some others, mount the die in a die cavity centrally formed in the substrate, for example, an enhanced ball grid array package. Currently, these packages tend to be symmetric in shape, for example, 35-mm×35-mm, 40-mm×40-mm, etc.

FIG. 1 is a diagrammatic illustration of a cross-sectional view of a conventional plastic ball grid array package having a die centrally mounted on the surface of the substrate. Package 100 includes a substrate 102 having a die 104 centrally mounted on the top surface. Bond fingers 106, peripheral to the die 104, are formed on the surface of the substrate 102. The bond fingers 106 are typically connected by traces 118 to associated conductive vias 108 which pass through the substrate 102 and connect to associated contact landings 110, on the opposite surface of the substrate 102, on which contacts 112, such as solder balls, are formed. Bond pads 114 of the die 104 are connected to the bond fingers 106, for example, by wire bonding, to provide conductive interconnection of the die 104 to the contacts 112. Typically, an encapsulant 116, e.g., a plastic cap, is molded over the die 104 and the wires.

While the ball grid array package of FIG. 1 is suitable for many purposes, it has a limited heat dissipation capability. For dice requiring higher heat dissipation or other package properties, other package structures have been developed. Many of these designs mount the die within a cavity in the substrate so that the die is thermally connected to a heat-dissipating layer of the substrate. The package may then be mounted on another substrate, such as a printed circuit board, so that the heat-dissipating layer is facing out.

FIG. 2 is a diagrammatic illustration of a cross-sectional view of a conventional enhanced ball grid array-type package having a die mounted in a central die cavity formed in the package substrate. Package 200 includes a substrate 202 having a die 204 located in a central die cavity 206. Typically, the substrate 202 includes a thermally conductive layer 208, such as a copper plate, and the cavity 206 is formed in the surface of the substrate 202 exposing a portion of the conductive layer 208 within the cavity 206. The die 204 is mounted on the substrate 202 within the die cavity 206 and thermally connected to the conductive layer 208 of the substrate 202. Bond pads 212 on the die 204 are electrically connected to bond fingers 210 formed on the top surface of the substrate 202, for example, by wire bonds 214. Conductive traces 220 routed across the surface of the substrate 202 electrically interconnect the bond fingers 210 to contact landings 216 on which contacts 218, such as solder balls, are formed. In some package designs, the bond fingers 210, traces 220, and contact landings 216 may be formed on a laminate layer of the substrate 202. A resin dam is formed on the surface of the substrate 202 to contain an encapsulant 222 formed over the die 204 and wire bonds 214.

When packaging a die where a significantly greater number of signal routings may be required from one side of the die than from an opposite side of the die, available routing space is one determinant of the package size. If enough routing space is not available on the substrate to route signals from one side of a die, often a larger package size is required to effect the required routings.

FIG. 3 is a diagrammatic illustration of a top view of the substrate of the enhanced ball grid array-type package of FIG. 2. For sake of clarity and ease of description, only a small exemplary portion of the bond fingers and traces are shown in the present illustration. In use, a much greater number may be present.

In FIG. 3, the intersection of the bisecting lines X and Y indicates substantially the center point 224 of the surface of the substrate 202. Conventionally, the die cavity 206 is centrally formed about the center point 224 of the surface of the substrate 202. Note that while the package substrate 202 is symmetric, the die cavity 206 is rectangular in shape to accommodate a die, such as a networking die, earlier described. Thus, substantially, D1=D3 and D2=D4. The bond fingers 210 are typically located a specified distance, D5, peripheral to the die cavity 206, and contact landings 216 are located in a grid array formation peripheral to the bond fingers 210. Thus, there is a limited amount of surface area on the substrate 202 for use in routing the traces 220 between the bond fingers 210 and the contact landings 216, e.g., the surface area described by D1, D2, D3, and D4.

For example, suppose the substrate 202 is 35-mm×35-mm having a grid array formation of contact landings 216 peripheral to the bond fingers 210 and central die cavity 206 such that D1=D3. The die to be packaged has a high density of bond pads so that it is necessary to route, for example, 22 signals from the top left of the die to contact landings 216 within a perpendicular distance 230 of 2.6921-mm. In this example, the perpendicular distance 230 may be measured as the distance between the perpendiculars drawn from the outermost bond fingers 210, to be routed from, to contact landings 216 to be routed to. However, to accomplish this routing using 75$\mu$ trace lines and space traces, the minimum distance needed is 22 signals×(75+75) $\mu$/signal=3.3-mm. Thus, a larger substrate having a greater substrate area between the bond fingers 210 and contact bond pads 208, e.g., a greater D1, will be needed to achieve the 3.3-mm distance and effect the routings.

When the die is relatively uniform in its distribution of bond pads on the different sides of the die, this increase of package size for acquisition of needed routing area on the substrate is an expected trade-off for utilizing a high density die. However, with a die having unequal bond pad densities, the use of a larger substrate to effect routings from a higher density side of a die, despite available routing space on a lower density side of the die, is an inefficiency to be mitigated, as it increases the packaging size and costs for that die.

FIG. 4 is a general diagrammatic illustration of an example of non-uniform bond pad distribution on a die. In the illustration, M, N and n represent a number of die bond pads, where N much greater than n, N>>n. In one example, M and N may represent the number of digital bond pads on a die 400, and n may represent the number of analog bond pads. Thus, when the die 400 is packaged, the routing trace density on the side of the substrate adjacent the N side of the die will be greater than the routing trace density on side of the substrate adjacent the n side of the die. Thus, using the earlier example described with reference to FIG. 3, if the signal routing requirements on the N side of the die cannot be accommodated within available routing space on the substrate adjacent the N side of the die, a larger package size will be required to gain the needed routing space despite available routing space on the substrate adjacent the n side of the die.

Consequently, there is a need to more efficiently utilize the available routing space on grid array-type packages where the packaged die has a non-uniform distribution of bond pads on the die, and to reduce the size of grid array-type packages used in packaging a die having non-uniform distribution of bond pads.

SUMMARY OF THE INVENTION

In accordance with the present invention, there are described several embodiments of integrated circuit packages having offset placement of the die relative to the center point of the surface of the package substrate.

Generally, the several embodiments of the present invention describe grid array-type integrated circuit packages having an attached die offset relative to the center point of the package substrate. The substrate includes a plurality of bond fingers electrically connected to associated contacts or contact landings via conductive traces and/or vias. Bond pads on the die are electrically connected to associated bond fingers on the substrate. In packaging a die having a greater number of bond pads on a first side of the die than an opposite second side, the die is offset relative to the center point of the substrate in a direction away from the first side of the die and toward the second side of the die. This offset allows a larger amount of the substrate surface area adjacent the first side of the die to be made available for routing traces associated with the bond pads on the first side of the die.

In one embodiment, a grid array-type integrated circuit package having a die mounted within a die cavity formed in the top surface of the substrate and offset relative to the center point of the top surface of the substrate is described.

In another embodiment, a grid array-type integrated circuit package having a die mounted on a die attach area offset relative to the center point of the package substrate is described.

In another embodiment, a package substrate panel for use in packaging integrated circuits is described, in which at least one device area of the substrate panel has a die cavity offset relative to the center point of the device area.

In another embodiment, a package substrate panel for use in packaging integrated circuits is described in which at least one device area of the substrate panel has a die attach area offset relative to the center point of the device area.

BRIEF DESCRIPTION OF THE DRAWINGS

The present invention may best be understood by reference to the following description taken in conjunction with the accompanying drawings in which.

DETAILED DESCRIPTION OF THE INVENTION

According to the present invention, integrated circuit packages having a die offset relative to the center point of the surface of the package substrate are described. More particularly, integrated circuit packages having a die cavity or die attach area offset relative to the center point of the surface of the package substrate are described. In some embodiments, the die may have an uneven distribution of bond pads, where the density of bond pads is higher on a first side, than on an opposite second side. The die is offset on the substrate relative to the center point of the surface of the substrate away from the higher density first side of the die and toward the lower density second side, so as to increase the available routing space on the substrate adjacent the higher density side of the die. The use of the present invention may allow a more efficient utilization of available substrate surface area for routing signals from the die to the package with a die having an uneven distribution of bond pads; and, in some cases, may allow the reduction in the size of the package substrate used in packaging the die.

In the following description, numerous specific details are set forth in order to provide a thorough understanding of the present invention. It will be appreciated, however, to one skilled in the art, that the present invention may be practiced without some or all of these specific details. In other instances, well-known process operations have not been described in detail in order not to unnecessarily obscure the present invention.

Figure 5:
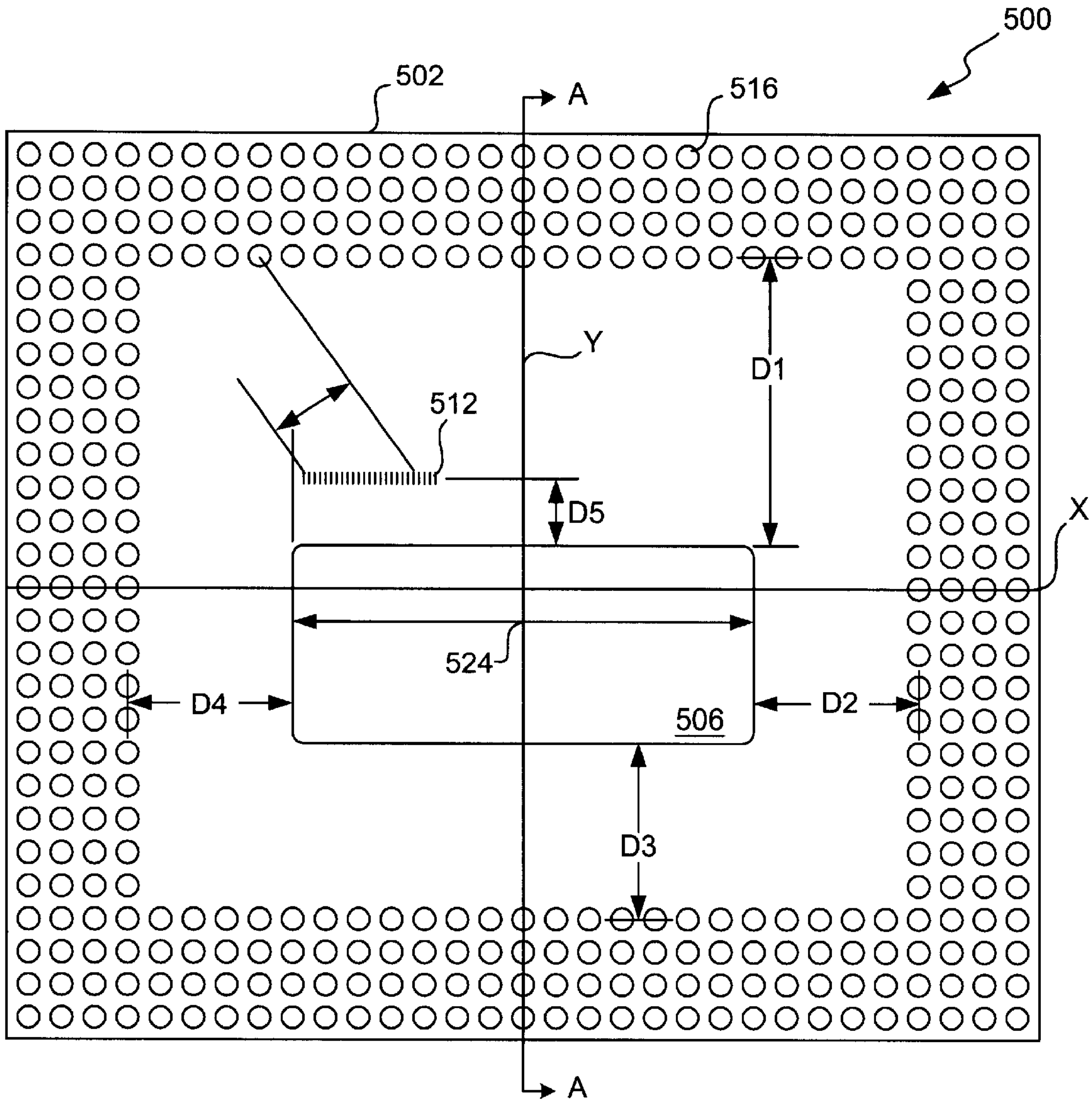
FIG. 5 is a diagrammatic illustration of a top view of the substrate of an enhanced ball grid array-type package having a die cavity offset relative to the center point of the surface of the substrate, according to one embodiment of the present invention.

FIG. 5 is a diagrammatic illustration of a top view of the substrate of an enhanced ball grid array-type package having a die cavity offset relative to the center point of the surface of the substrate, according to one embodiment of the present invention. For sake of clarity and ease of description, the die, wire bonds, contacts and encapsulant are not shown. It will be appreciated that in use, these components would typically be present. Further, while only a small portion of the bond fingers and traces are shown in the present illustration, in use, a much greater number may be present. Additionally, it will be appreciated that the illustration is not drawn to scale to aid in description.

In FIG. 5, the intersection of the bisecting lines X and Y indicates substantially the center point 524 of the surface of the substrate 502 of the package 500. In one embodiment, a die cavity 506 is formed in the surface of the substrate 502 and offset relative to the center point 524. In use, typically a die (not shown) would be mounted within the die cavity 506. It will be appreciated that in some embodiments, the die may be mounted in a die attach area (not shown) which may or may not be demarcated. Further, in some embodiments, a die attach pad (not shown) may be present within the cavity 506 and the die would be mounted on the die attach pad.

As illustrated, the package substrate 502 and the die cavity 506 are rectangular in shape to accommodate a die, such as a mixed signal die, earlier described. However, it will be appreciated that in other embodiments the substrate 502 and/or die cavity 506 may be differently shaped. In FIG. 5, the bond fingers 512 are formed on the surface of the substrate 502 a specified distance D5 from the cavity 506. Thus, in offsetting the cavity 506 relative to the center point 524 of the substrate 502, the bond fingers 512 are formed so as to maintain a set distance from the cavity 506. As earlier discussed, the bond fingers 510 may represent the outermost ring of multiple rows of bond fingers located between the die cavity 506 and the outer most ring of bond fingers 512. And thus, in those embodiments, the internal rows of bond fingers would be formed to maintain a set distance from the die cavity 506 as well. It will be appreciated that in other embodiments the bond fingers 512 may be differently distributed on the substrate 502.

Figure 1:
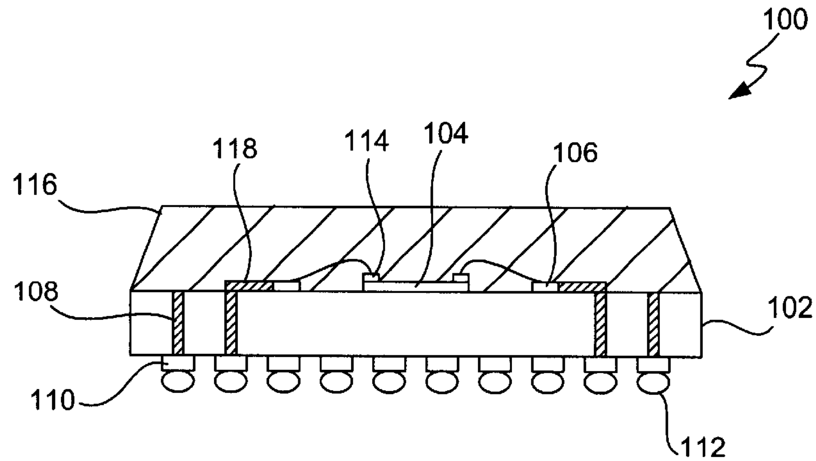
FIG. 1 is a diagrammatic illustration of a cross-sectional view of a conventional plastic ball grid array package having a die centrally mounted on the surface of the substrate.
Figure 2:
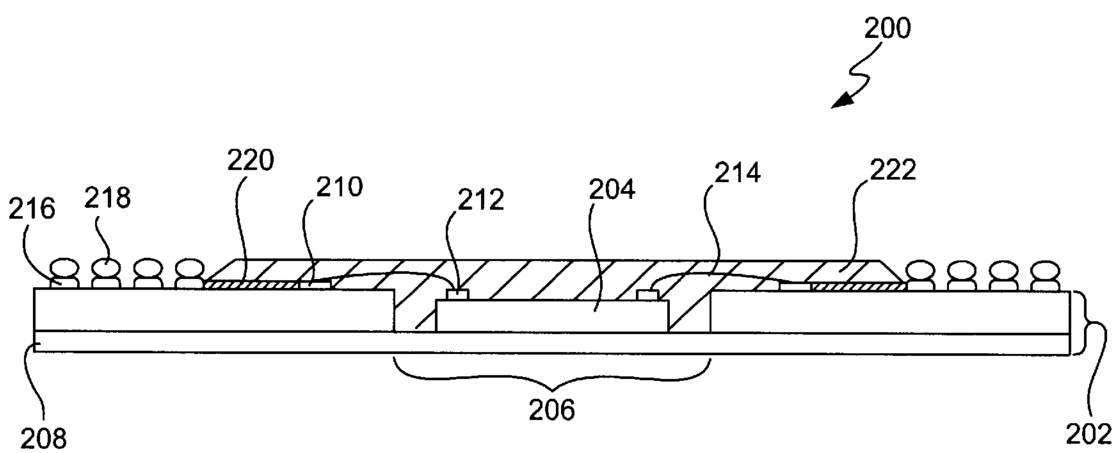
FIG. 2 is a diagrammatic illustration of a cross-sectional view of a conventional enhanced ball grid array-type package having a die mounted in a central die cavity formed in the package substrate.
Figure 3:
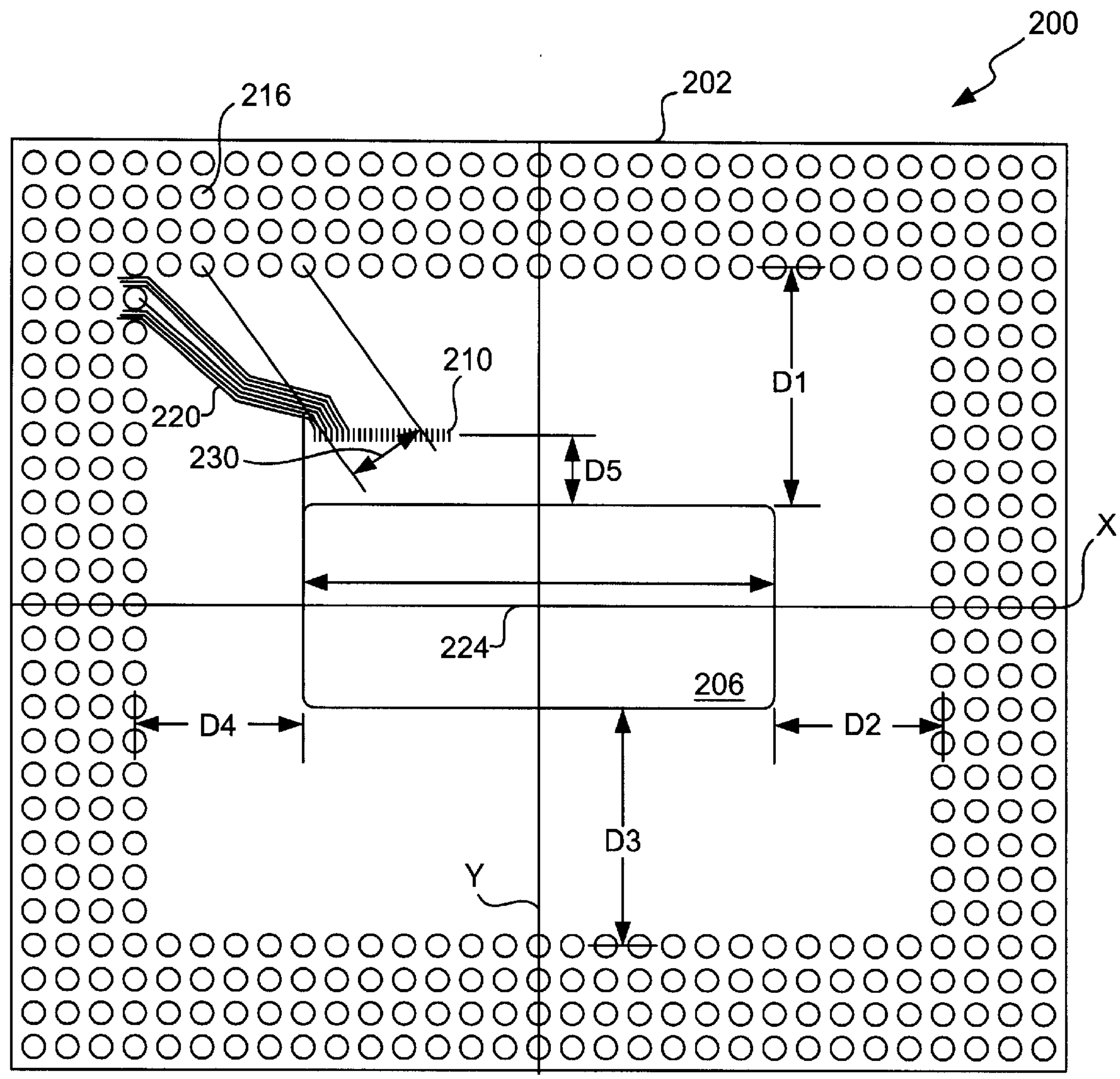
FIG. 3 is a diagrammatic illustration of a top view of the substrate of the enhanced ball grid array-type package of FIG. 2.
Figure 4:
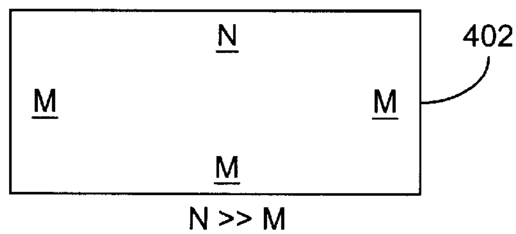
FIG. 4 is a general diagrammatic illustration of an example of non-uniform bond pad distribution on a die.

In the present embodiment, the die to be packaged may be similar to that illustrated and described earlier with regard to FIG. 4, in which the die 400 has an uneven distribution of bond pads such that the density of bond pads on the N side of the die is much greater than the density of bond pads on the n side of the die. It will, however, be appreciated that in other embodiments, the distribution may be reversed, or further augmented as later described herein. As illustrated, if the die 400 is packaged so that the higher density N side of the die 402 is adjacent the D1 area of the substrate and the lower density n side of the die is adjacent the D3 area of the substrate, the die cavity 506 is offset relative to the center point 524 of the substrate away from the N side of the die having the greater density of bond pads and toward the n side of the die having the lower density of bond pads. Thus, D1>D3. Offset of the die cavity 506 in this way increases the available area on the substrate adjacent the higher density side of the die 400, and also increases access to routable contact landings 516 on the sides of the substrate 502.

Figure 6:
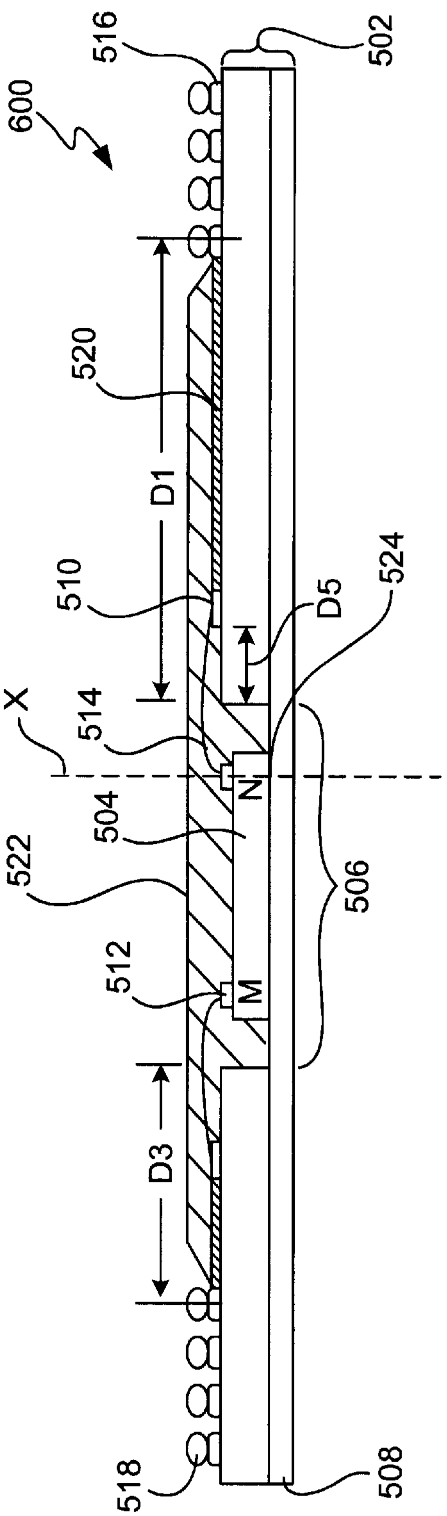
FIG. 6 is a diagrammatic illustration of a cross-sectional view of the enhanced ball grid array-type package of FIG. 5 including the packaged die, according to one embodiment of the present invention.

FIG. 6 is a diagrammatic illustration of a cross-sectional view of the enhanced ball grid array-type package of FIG. 5 taken along A—A, including the packaged die, according to one embodiment of the present invention. In the present illustration, the package 600 shows a die 504 located in the central die cavity 506. The die 504 is mounted on the substrate 502 within the die cavity 506 and thermally connected to the conductive layer 508 of the substrate 502. Bond pads 512 on the die 504 are electrically connected to bond fingers 510 formed on the top surface of the substrate 502, for example, by wire bonds 514. As earlier described, in some embodiments, there may be more than one row of bond fingers, and thus, in those embodiments, the bond fingers 510 would represent the outermost row of bond fingers. Conductive traces 520 routed across the surface of the substrate 502 electrically interconnect the bond fingers 510 to contact landings 516 on which contacts 518, such as solder balls, are formed. In some embodiments, the bond fingers 510, traces 520, and contact landings 516 may be formed on a laminate layer of the substrate 502. A resin dam is formed on the surface of the substrate 502 to contain an encapsulant 522 formed over the die 504 and wire bonds 514.

FIG. 6 further illustrates how offsetting the cavity 506 in the substrate 502 relative to the center point 524 in the direction toward the lower density side of the die 504, i.e., the n side, increases the surface area of the substrate adjacent the higher density N side of the die 504, i.e., D1, over a centrally located die cavity. Thus, in this embodiment, D1>D3, and D1 provides more space for routing traces 514 than would have been available had the cavity 506 been centrally located. And, as earlier described, in some instances where a centrally located die cavity package would have required a larger substrate to accommodate the routing of signals on the high bond pad density side of a die, offsetting the die cavity may allow use of a smaller package substrate.

The above embodiments of the present invention have been described in terms of offset of a die cavity from the center point of the top surface of the package substrate where the package was an enhanced ball grid array-type package. It will be appreciated that although the above embodiments have been described in terms of a cavity package that is attached cavity down to another substrate, the present invention is not limited to cavity packages nor to cavity down packages; and, the present invention may be extended to other embodiments in which the die is mounted on the surface of the substrate, i.e., not mounted in a die cavity.

Figure 7:
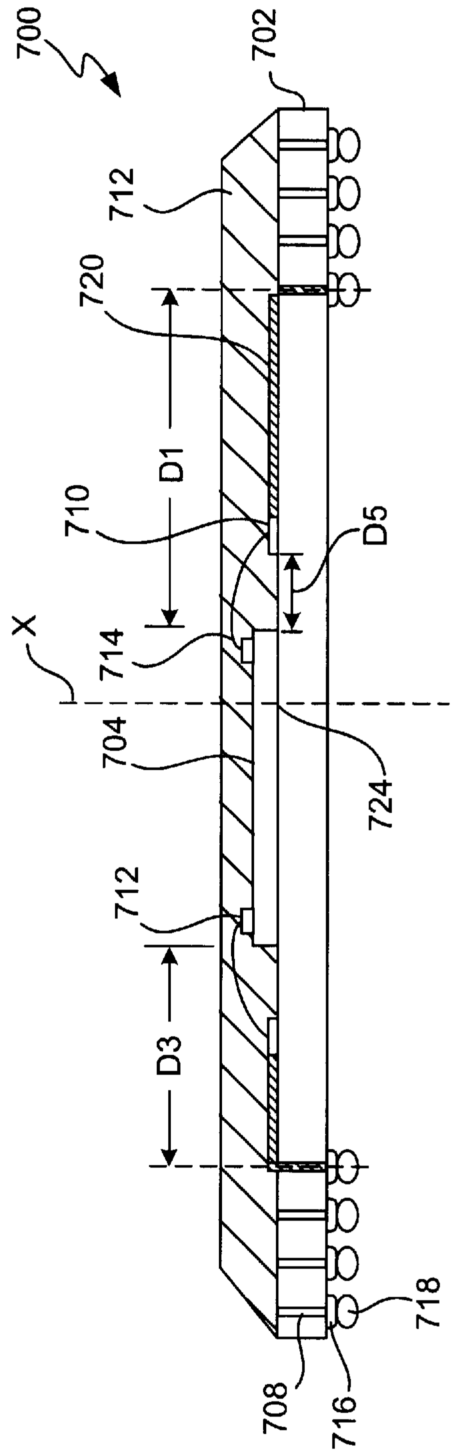
FIG. 7 is a diagrammatic illustration of a cross-sectional view of a ball grid array-type package having a die attached on the surface of the package substrate and offset relative to the center point of the surface of the substrate, according to another embodiment of the present invention.

FIG. 7 is a diagrammatic illustration of a cross-sectional view of a ball grid array-type package having a die attached on the surface of the package substrate and offset relative to the center point of the surface of the substrate, according to another embodiment of the present invention. The present embodiment illustrates how offsetting the die on the package relative to the center point of the surface of the package substrate can be extended from cavity packages, as earlier described with reference to FIGS. 5 and 6, to other types of packages, such as surface mount packages.

As illustrated, the package 700 includes a die 704 mounted on the surface of the substrate 702, rather than in a die cavity, and offset relative to the center point 724 of the surface of the substrate 702. As earlier described, with reference to FIGS. 4, 5 and 6, the offset of the die is dependent upon the die to be packaged, and that, generally, the die 704 is offset in a direction away from the higher density side of the die and toward the lower density side of the die, to provide more routable surface area on the surface of the substrate adjacent the higher density side of the die. Thus, in the present embodiment, the die 704 may be a die similar to that described with reference to FIG. 4, where the higher density side of the die, e.g., the N side, is adjacent D1, and the lower density side, e.g., the n side, is adjacent D3. It will be appreciated that in some embodiments, the die 704 may be mounted in a die attach area (not shown) which may or may not be demarcated, and may include a die attach pad (not shown). Bond fingers 710, peripheral to the die 704, are formed on the surface of the substrate 702. The bond fingers 710 are connected by traces 720 to associated conductive vias 708 which pass through the substrate 702 and connect to associated contact landings 716 on the opposite surface of the substrate 702, on which contacts 718, such as solder balls, are formed. Bond pads 712 of the die 704 are connected to the bond fingers 710, for example, by wire bonds 714, to provide conductive interconnection of the die 704 to the contacts 718. An encapsulant 722, such as a plastic cap, may be molded over the die 704 and the wire bonds 714.

The above-described embodiments have illustrated the present invention in packages having a die mounted in a die cavity or on a die attach area offset relative to the center point of the surface of the substrate. However, it will be appreciated that the manufacture of these packages may take different interim forms, such as a substrate panel which may include several device areas. The present invention includes these interim forms as well.

Figure 8:
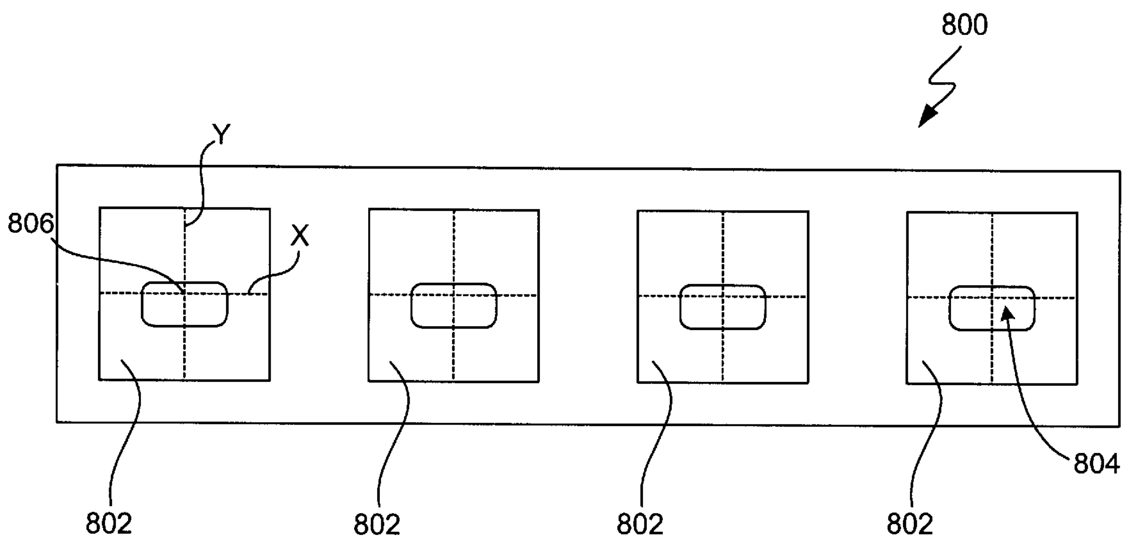
FIG. 8 is a diagrammatic illustration of a top view of a ball grid array-type package substrate panel having individual device areas in which a die cavity is offset relative to the center point of the device area, according to one embodiment of the present invention.

FIG. 8 is a diagrammatic illustration of a top view of a ball grid array-type package substrate panel having individual device areas in which a die cavity is offset relative to the center point of the device area, according to one embodiment of the present invention. In the illustration, the substrate panel 800 is shown including three device areas 802. It will be appreciated that the number of device areas 802 may also be more or less than three. The intersection of the bisecting lines X and Y indicates substantially the center point 806 of each device area 802, and the die cavity 804 is offset relative to the center point 806 of each device area 802. Although not shown, as earlier described with reference to FIGS. 5 and 6, each device area 802 may further include bond fingers formed on the surface of each device area 802 and interconnected via conductive traces to contact landings on which contacts, such as solder balls, may be formed. The die cavity 804 may be offset in any direction relative to the center point 806 of each device area 802 according to the bond pad distribution of the die to be later packaged, so as to increase the available routing space on the side of the substrate adjacent the higher density side of the die.

As earlier described with reference to FIG. 7, the present invention is also applicable to packages in which the die is mounted on the surface of the substrate. Thus, in addition to substrate panels having die cavities offset relative to the center point of each device area, the present invention is also includes substrate package panels having die attach areas offset relative to the center point of each device area.

Thus, there have been described several embodiments of integrated circuit packages having a die offset relative to the center point of the package substrate. The die may be mounted within a die cavity formed in the package substrate and offset relative to the center point of the substrate, or mounted in a die attach area on the surface of the substrate and offset relative to the center point of the substrate.

Generally, the die cavity or die attach area is offset relative to the center point of the substrate in a direction away from the higher density side of the packaged die and toward the lower density side, so as to increase the available surface area on the substrate adjacent the higher density side of the die to effect routings from the higher density side of the die.

It will be appreciated that the present invention is not limited to the above-described embodiments and may be extended to any type of grid array-type package or package substrate, in which offsetting of the die relative to the center point of the substrate results in increased routing space on the side of the substrate adjacent the higher bond pad density side of the die.

Additionally, while the present invention has been described in terms of offset of the die relative to the center point of the surface of the substrate in a direction away from the side having the highest bond pad density and toward an opposite side having a lower bond pad density, it will be appreciated that the offset may be differently implemented to achieve a preferred efficiency in use of the available substrate surface area. For example, where a die may have two sides with unequal high bond pad density and two sides with equal or unequal low bond pad density, the cavity may be offset relative to the center point of the surface of the substrate according to a vector calculated to achieve more substrate space for each of the higher density sides in an apportioned manner.

Also, while the present invention has been described in terms of offset of the die, die cavity, and die attach area relative to the center point of the surface of the substrate, it will be appreciated that the center point may be described in other terms relative to different structures in the package, and that the present invention is includes such different definitions that result in an offset of the die from a point substantially at the center point of the surface of the substrate, or that achieve increased routing space on the substrate adjacent the higher density side(s) of the die by offset of the die, die cavity, or die attach area on substrate.

Further, while the present invention as been described in terms of a single packaged die, it will be appreciated that the die may also be a multi-chip module (MCM), as well.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

I claim:

1. A grid array-type integrated circuit package comprising:

a non-conductive substrate including a top surface and a bottom surface, the top surface having a center point, the substrate further including a plurality of conductive bond fingers, each bond finger being electrically connected to an associated contact landing via conductive traces, the contact landings having contacts formed thereon; and an integrated circuit die attached to the substrate and offset relative to the center point, the die having a plurality of bond pads that are electrically connected to associated ones of the bond fingers, the bond pads serving as input/output contacts for circuit components of the die, wherein the die including opposing first and second sides, and third and fourth sides has a greater number of bond pads being located on the first side than on the second side, and the die is offset relative to the center point away from the first side; and wherein at least some of the contacts on the substrate are positioned outward from each of the first, second, third, and fourth sides of the die.

2. The grid array-type integrated circuit package as recited in claim 1 wherein the substrate further includes a cavity, the cavity being offset relative to the center point of the top surface of the substrate, and the integrated circuit die is mounted in the cavity.

3. The grid array-type integrated circuit package as recited in claim 2 wherein the cavity is offset relative to the center point of the top surface of the substrate in a direction away from the first side of the die and toward the second side of the die, thereby increasing the area on the surface of the substrate adjacent the first side of the die available for routing conductive traces from the first side of the die to the conductive landings.

4. The grid array-type integrated circuit package as recited in claim 2 wherein the die includes analog circuits and digital circuits, wherein a first group of the bond pads are input/output contacts for the digital circuits and are generally located on the first side of the die and a second group of the bond pads are input/output contacts for the analog circuits and are generally located on the second side of the die opposite the first side, the density of the first group of bond pads being greater than the density of the second group of bond pads, and wherein the cavity is offset from the center point of the top surface of the substrate in a direction toward the second side of the die.

5. The grid array-type integrated circuit package as recited in claim 2 wherein:

the die has more bond pads along a first edge of the die than along a second edge of the die that is opposite the first edge; and the cavity is offset from the center point of the top surface of the substrate in a direction away from the first edge of the die such that a larger portion of the top surface of the substrate is available on the side of the substrate adjacent the first edge of the die than would be if the cavity were centered on the center point of the top surface of the substrate, to facilitate routing conductive traces on the top surface of the substrate.

6. The grid array-type package as recited in claim 2 wherein the bond pads are electrically coupled to the bond fingers using bonding wires, the package further comprising an encapsulant that covers at least the die and the bonding wires.

7. The grid array-type integrated circuit package as recited in claim 1, wherein the die has bond pads located along all four sides of the die, and the substrate has bond fingers located adjacent all four sides of the die.

8. A grid array-type integrated circuit package comprising:

a non-conductive substrate including a top surface and a bottom surface, the top surface having a center point and a plurality of conductive bond fingers thereon and a die attach area thereon, the die attach area being offset relative to the center point of the top surface of the substrate, the bottom surface having a plurality of contacts thereon, each contact being electrically connected to an associated one of the bond fingers; and an integrated circuit die mounted on the die attach area such that the die is offset relative to the center point of the substrate, the die having a plurality of bond pads that are electrically connected to associated ones of the bond fingers, the bond pads serving as input/output contacts for associated circuit components of the die, wherein the die including opposing first and second sides, and third and fourth sides has a greater number of bond pads being located on the first side than on the second side, and the die is offset relative to the center point away from the first side; and wherein at least some of the contacts on the substrate are positioned outward from each of the first, second, third, and fourth sides of the die.

9. The grid array-type integrated circuit package as recited in claim 8 wherein the die attach area is recessed in a die cavity formed in the substrate, the die cavity being offset relative to the center point of the top surface of the substrate.

10. The grid array-type integrated circuit package as recited in claim 8 wherein the die includes analog circuits and digital circuits, wherein a first group of the bond pads are input/output contacts for the digital circuits and are generally located on a first side of the die and a second group of the bond pads are input/output contacts for the analog circuits and are generally located on a second side of the die opposite the first side, the density of the first group of bond pads being greater than the density of the second group of bond pads, and wherein the cavity is offset from the center point of the top surface of the substrate in a direction toward the second side of the die.

11. The grid array-type integrated circuit package as recited in claim 8 wherein:

the die has more bond pads along a first edge of the die than along a second edge of the die that is opposite the first edge; and the die attach area is offset from the center point of the top surface of the substrate in a direction away from the first edge of the die such that a larger portion of the top surface of the substrate is available on the side of the substrate adjacent the first edge of the die than would be if the die attach area were centered on the center point of the substrate, to facilitate routing conductive traces on the top surface the substrate.

12. The grid array-type integrated circuit package as recited in claim 8 wherein the substrate further includes:

a plurality of electrically conductive vias that pass through the substrate; and a plurality of traces that electrically couple selected bond fingers to associated vias on the top surface of the substrate; and wherein the bond fingers are electrically connected to associated contacts by at least associated vias and traces.

13. The grid array-type package as recited in claim 8 wherein the bond pads are electrically coupled to the bond fingers using bonding wires, the package further comprising a plastic cap that encapsulates at least the die and bonding wires.

14. A package substrate panel for use in packaging integrated circuits, the package substrate panel being formed from a non-conductive material and comprising:

at least one array of device areas defined thereon, each device area including a top surface and a bottom surface, the top surface having a center point and a die cavity formed therein, the cavity being offset relative to the center point of each device area; and wherein each device area further includes:

a plurality of bond fingers;

a plurality of contact landings; and a plurality of conductive traces that electrically interconnect selected bond fingers to associated contact landings, wherein the package substrate panel includes opposing first and second areas, and third and fourth areas adjacent to the die cavity, and has a greater number of the bond fingers being located on the first area than on the second area, and the die cavity is offset relative to the center point away from the first area; and wherein at least some of the bond fingers are positioned outward from each of the first, second, third, and fourth areas of the package substrate panel.

15. The package substrate panel as recited in claim 14 wherein each device area further includes a heat-dissipating layer, a portion of the heat-dissipating layer being exposed within the die cavity.

16. A package substrate panel for use in packaging integrated circuits, the package substrate panel being formed from a non-conductive material and comprising:

at least one array of device areas defined thereon, each device area including a top surface and a bottom surface, the top surface having a center point and a die attach area formed thereon, the die attach area being offset relative to the center point of the device area; and wherein each device area further includes:

a plurality of bond fingers formed on the top surface of the device area;

a plurality of contact landings formed on the bottom surface of the device area; and a plurality of conductive vias formed through the device area, the conductive vias being interconnected to associated bond fingers by conductive traces, the conductive vias connecting to associated contact landings formed on the bottom surface of the device area, wherein the package substrate panel includes opposing first and second areas, and third and fourth areas adjacent to the die attach area, and has a greater number of the bond fingers being located on the first area than on the second area, and the die attach area is offset relative to the center point away from the first area; and wherein at least some of the bond fingers are positioned outward from each of the first, second, third, and fourth areas of the package substrate panel.

* * * * *